United States Patent [19]

Vedrenne et al.

[11] Patent Number: 4,951,008
[45] Date of Patent: Aug. 21, 1990

[54] SUSPENDED-LINE DIODE DEVICE COMPRISING A TRIPLE PLATE LINE

[75] Inventors: Christian Vedrenne, Le Perreux; Patrick Desmarest, Montigny les Cormeille; Bernard Guerin, Aulnay Sous Bois, all of France

[73] Assignee: Thomson Hybrides et Microondes, Paris, France

[21] Appl. No.: 163,841

[22] Filed: Mar. 3, 1988

[30] Foreign Application Priority Data

Mar. 6, 1987 [FR] France ................................ 87 03075

[51] Int. Cl.$^5$ .............................................. H01P 1/22
[52] U.S. Cl. ................................... 333/17.2; 333/247; 333/164; 333/262
[58] Field of Search ...................... 333/17 L, 247, 250, 333/262, 81 A, 103, 104, 164, 17.2

[56] References Cited

U.S. PATENT DOCUMENTS

| | | | |
|---|---|---|---|
| 2,439,651 | 4/1948 | Dome | 333/103 |
| 3,309,626 | 3/1967 | Higgins | 333/17.2 |
| 3,559,109 | 1/1971 | Matsushige et al. | 333/104 |
| 3,648,114 | 3/1972 | Manuoli et al. | 333/103 X |

FOREIGN PATENT DOCUMENTS

| | | | |
|---|---|---|---|
| 973664 | 2/1951 | France . | |
| 1479516 | 5/1967 | France | 333/103 |
| 2071043 | 9/1971 | France . | |
| 2133169 | 11/1972 | France . | |

OTHER PUBLICATIONS

Patent Abstracts of Japan, vol. 4, No. 137, Sep. 25, 1980, Japanese Appl. No. 53-163194.
IEEE Transactions on Microwave Theory and Techniques, vol. MTT-22, No. 6, Jun. 1974, pp. 675-687; R. W. Burns et al., "Low Cost Design Techniques For Semiconductor Phase Shifters".
H. J. Reich et al., "Microwave Theory and Techniques", 1953, pp. 131-141.
Philips Technisch Tijdschrift, vol. 32, 1971, pp. 277-284, J. H. C. Van Heuven, "Pin-Schakeldiodes in Fasedraaiers voor Elektronisch Bestuurde Antennesystemen".

Primary Examiner—Eugene R. LaRoche
Assistant Examiner—Benny Lee
Attorney, Agent, or Firm—Oblon, Spivak, McClelland, Maier & Neustadt

[57] ABSTRACT

Disclosed is a hyperfrequency device which includes a triple plate line in which at least two diodes exert their action at the same point on the suspended line. Instead of connecting the two diodes on both sides of the suspended line, they are mounted on the same side, this is possible by providing two subsidiary line sections orthogonal to the main line and in the same hyperfrequency plane. A diode is connected to the end of each subsidiary line at a point distant by $\lambda g/2$ from the central point of the main line. The action of the two diodes is thus brought back to this point.

7 Claims, 2 Drawing Sheets

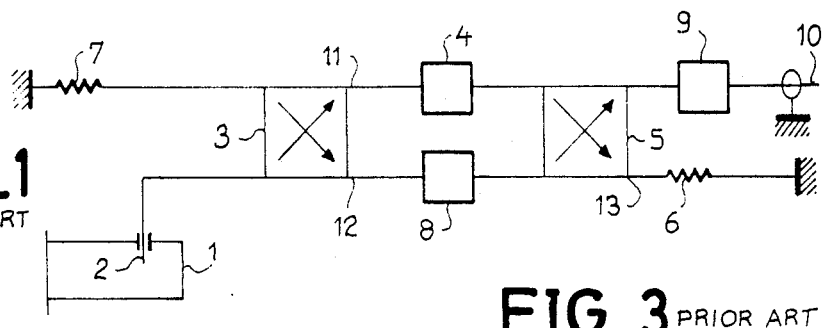
FIG_1 PRIOR ART
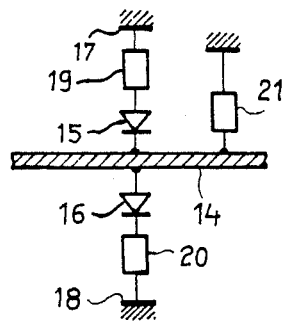
FIG_2 PRIOR ART
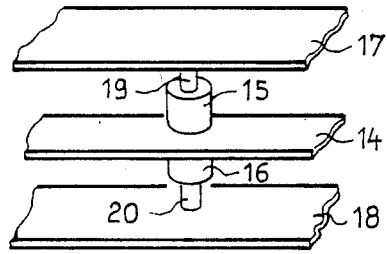
FIG_3 PRIOR ART
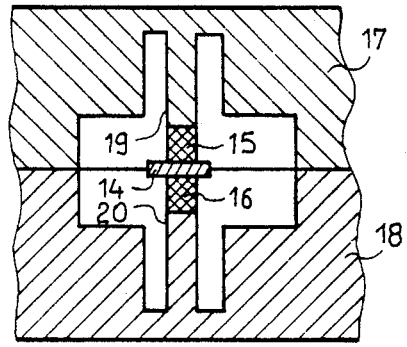
FIG_4 PRIOR ART
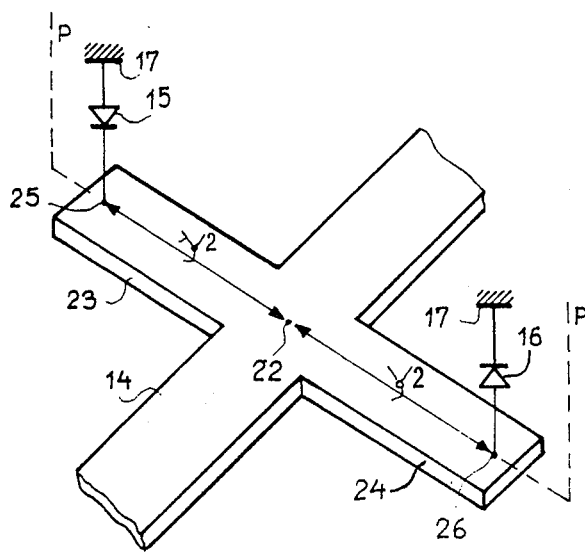
FIG_5

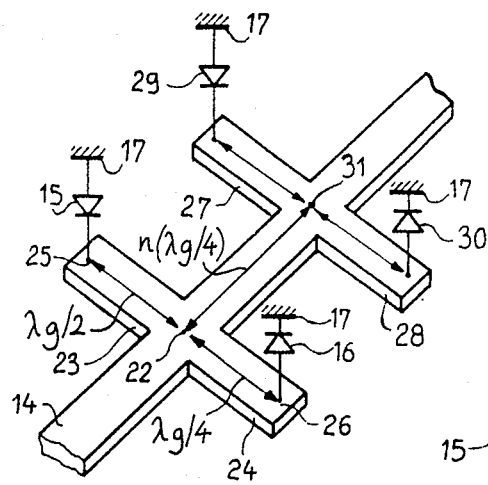
FIG_6
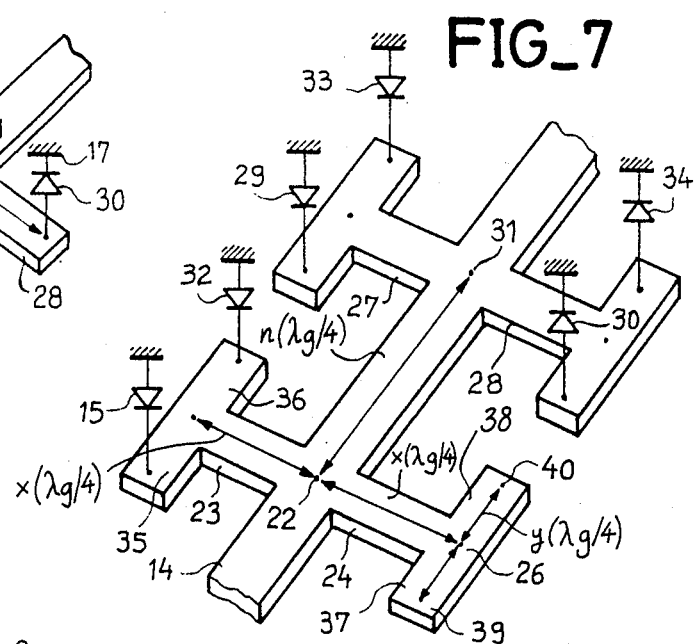
FIG_7
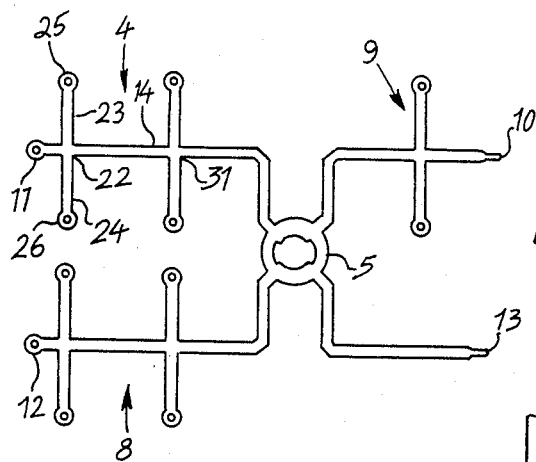
FIG_8
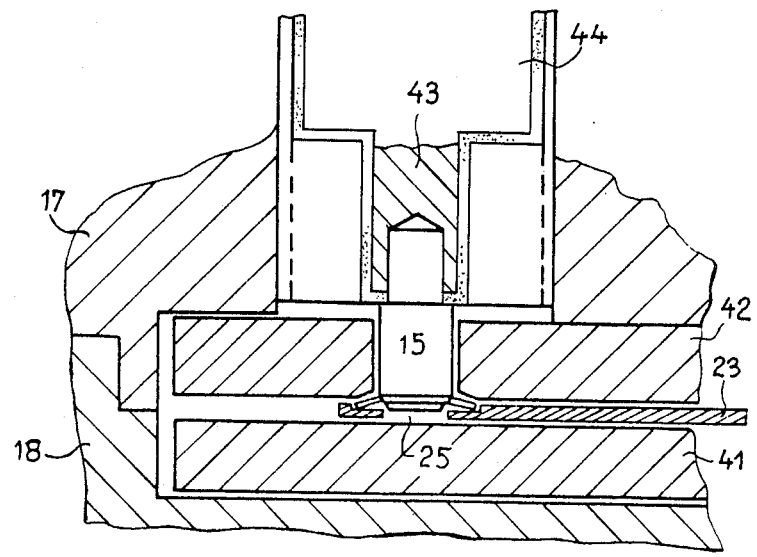
FIG_9

SUSPENDED-LINE DIODE DEVICE COMPRISING A TRIPLE PLATE LINE

BACKGROUND OF THE INVENTION

1. Field of the Invention

The present invention relates to a hyperfrequency device having at least one triple plate line and at least one passive limiter formed by two diodes connected electrically in series, the suspended line between the two ground planes of the triple plate line forming a common point for the diodes.

The invention has been designed so that the diodes are readily accessible when the device is mounted in complex hyperfrequency equipment, and for this purpose the diodes are mounted on the same side of the suspended line.

2. Discussion of the Background

So that the description of the invention is clear, the example of a power limiter will be chosen for explaining the text and the figures, without this limiting the scope of the invention which concerns any device in which two series diodes are mounted on each side of a triple plate line, from an electrical point of view. In fact, depending on the chosen configuration, the device of the invention is a power limiter, or a power phase shifter or, if the diodes are biased, a switch.

The term triple plate line is given to an element for the propagation of a hyperfrequency wave, in which a metal line is suspended in a dielectric medium, which may be air or a solid dielectric, between two ground planes situated on each side of the suspended metal line. A triple plate line acts, in the hyperfrequency circuit field, in a way comparable to coaxial lines.

It is known that two series diodes, mounted between a first ground plane, with the suspended line as a common point for both diodes, and a second ground plane, operate as a limiter and provide satisfactory performance from an electrical point of view. However, if a limiter mounted in complex equipment is considered it is apparent that for mounting, adjusting and maintaining the limiter it is not convenient to have diodes which are situated on both sides of the suspended line. If it is necessary for example to have access to one or more diodes, the whole triple plate line must be dismantled, which is often badly placed from a mechanical point of view, against a wave guide or a circulator, and which is not readily accessible.

The invention provides a solution to the problems of accessibility and the maintenance of a power limiter.

SUMMARY OF THE INVENTION

According to the invention, the two diodes of a diode passive limiter assembly are brought onto the same face of the suspended line by means of two subsidiary line sections which are in the same plane as the main line and are substantially orthogonal thereto. These sections have a length equal to a multiple of $\lambda g/2$, $\lambda g$ being the guided wave length in the line. The outgoing-incoming path of a wave in each subsidiary line is equal to or a multiple of $\lambda g$: the action of a diode mounted at the end of the subsidiary line is therefore the same as if this diode where mounted on the axis of the main line. It is then possible to mount the two diodes at the ends of the two subsidiary line sections, but on the same side with respect to the main line, in head to tail relation.

More precisely, the invention provides a hyperfrequency diode device comprising a triple plate line formed by a suspended line placed between two ground planes, and at least two diodes mounted in series and exerting their action at the same central point of the suspended line, which transports a hyperfrequency signal of guided wave length $\lambda g$, wherein two subsidiary line sections are connected to the main suspended line and are orthogonal thereto, and the two diodes are mounted in the same plane, each at a free end of a subsidiary line section, at a central point of the main suspended line, situated in the same plane, the effect of the two diodes under hyperfrequency conditions being such that they are brought back to said central point of the suspended line.

Various other objects, features and attendant advantages of the present invention will be more fully appreciated as the same becomes better understood from the following detailed description when considered in connection with the accompanying drawings in which like reference characters designate like or corresponding parts throughout the several views and wherein:

FIG. 1, a block diagram of a passive diode limiter of the prior art,

FIG. 2 an electric diagram of a limitation element whose operation is used in the limiter of FIG. 1, FIGS. 3 and 4 a practical construction of the limiter of FIG. 2, according to the prior art, FIG. 5 a suspended line element in accordance with the invention, FIGS. 6 and 7 a variant of FIG. 5 for withstanding a higher power, in accordance with the invention, FIG. 8 a constructional diagram of the suspended line of the power limiter in accordance with the invention.

FIG. 9 a sectional view of a triple plate line constructed in accordance with the invention.

DESCRIPTION OF THE PREFERRED EMBODIMENTS

FIGS. 1 to 4 are given for a better understanding of the problem solved by the invention, which brings an electrical solution to a mechanical problem.

It is sometimes necessary to limit the amplitude of hyperfrequency signals and, in this case, in accordance with an approach recognized for its efficiency, the limitation function is provided mainly by PIN diodes, mounted head to tail in a triple plate structure.

the advantage of this type of method is to be entirely passive, a passive limitation without external control being more reliable than an active limitation and, in any case, indispensable when protection against random signals is desired.

FIG. 1 shows the block diagram of a passive diode limiter, such as the one to which the invention refers.

The hyperfrequency energy which circulates in a wave guide 1 is taken off by a probe 2 and fed to a limiter, through a so called 3 db coupler, shown symbolically at 3 in FIG. 1. A first branch of the limiter comprises from an output 11 of the 3 db coupler, a diode limiting device 4, then a diagonal of a second 3 db coupler referenced at 5 and the energy is absorbed through a load 6 connected to ground. A second branch of the limiter comprises an absorbant load 7, one end of which is connected to ground, a diagonal of the first 3 db coupler with output through its terminal 12, then a diode limiting device referenced at 8, a diagonal of the second 3 db coupler referenced at 5, second limitation stage referenced 9 and output through a coaxial line at 10 and a terminal 13.

In operation, a part of the hyperfrequency taken by probe 2 is reflected by the limiting devices 4 and 8. The limiting device 9 limits the amplitude of the hyperfrequency signal coming from the limiting devices 4 and 8, at the coaxial output 10. The signal reflected by 9 is absorbed by the load 6.

The limiting devices shown symbolically by blocks 4–8 and 9 are each formed by at least one device having two diodes, such as shown in FIG. 2, and described in French Pat. No. 71 12746 filed Apr. 9, 1971 by the applicant.

In this patent, the hyperfrequency energy circulating in a suspended line 14 is limited by two diodes 15 and 16 connected in series, the suspended line 14 being connected to the common point between these two diodes. One of the diodes 15 is coupled to a first ground plane 17 of the triple plate line and the other diode 16 is coupled top the other ground plane 18 of this same triple plate line. Diodes 15 and 16 are preferably PIN diodes.

A PIN diode comprises two heavily doped P+ and N+ zones on each side of a zone I of high resisitivy and behaves at low level like a capacity with high leak resistance and at a high level like a low resistance, zone I being inundated with injected carriers.

Passive limitation by the diodes is obtained by positioning diodes associated in pairs, such as diodes 15 and 16, in the same hyperfrequency plane, namely in the same plane orthogonal to the suspended line 14. Since they are shunt connected in a transmission line and generally because of a series tuning represented by devices 19 and 20 and complementary parallel tuning represented by device 21, they minimize the low level losses and maximize the high level limitation.

The series connection of two diodes is particularly advantageous because it permits the return of the detected DC current but especially because it makes it possible to considerably reduce the very dissipative transitory operating conditions at the beginning of each incident pulse with high peak power, the high level resistance not yet being very low because there are few injected carriers.

The practical construction of a limiter in accordance with this principle is shown in FIG. 3 which is simplifed and in FIG. 4 which is a section of the triple plate line provided with the limiter. Diodes 15 and 16 are mounted inside cylindrical cases, welded directly to the suspended line 14, and the series matching means 19 and 20 are in the form of a coaxial length.

In the section shown in FIG. 4, it can be seen that these coaxial lengths 19 and 20 are machined in the metal mass of the ground planes 17 and 18.

From a mechanical point of view, a three plate line is a relatively bulky and heavy element, formed essentially of two metal blocks 17 and 18 which are fastened together by a large number of bolts which pass through them, it being understood that a line in which hyperfrequency energy propagates should not have leaks which lower the efficiency and are dangerous of the environment.

When it is necessary to adapt or replace for example a diode such as 15 or 16, it will be readily understood that dismantling the triple plate line is a delicate operation if it is surrounded by other devices which cooperate therewith in the formation of hyperfrequency equipment.

A first object of the invention is therefore to find an electrical solution to this mechanical problem, and to mount the diodes on the same side, preferably towards the outside of the hyperfrequency equipment with respect to the suspended line 14.

This is what is shown in FIG. 5, in which only one element of the suspended line 14 has been shown, so as to simplify the Figure., for explaining the operation of a diode limiter in accordance with the invention.

Next, consideration is given to a suspended line element 14 situated in a dielectric medium between two ground planes 17 and 18 which are not shown in this Figure.

Reference number 22 represents a point of this suspended line 14 in the plane of which two diodes are normally connected in the prior art, one above and the other below the suspended line 14.

A plane shown symbolically by the line P passing through point 22 is called the mechanical plane: this plane being orthogonal to the suspended line 14.

In the invention, two suspended line sections 23 and 24 are added to the suspended line 14, these sections passing through point 22 situated in the mechanical plane P. the subsidiary line sections 23 and 24 have length slightly greater than $\lambda g/2$, $\lambda g$ being the guided wave length in the line.

At two reference points 25 and 25 situated at a distance or a multiple of $\lambda g/2$ with respect to the point of origin 22, are fixed two diodes 15 and 16, on the same side with respect to the suspended line 14. These diodes 15 and 16 are mounted head to tail, that is to say that the anode of one is connected to a subsidiary line section 23 and its cathode is connected to the ground plane 17, whereas the cathode of the other is connected to the subsidiary line section 24 and its anode is connected to the ground plane 17.

From an electrical point of view the path travelled over by the hyperfrequency wave at point 22 is equal to $\lambda g/2$ for the outward travel and $\lambda g/2$ for the inward travel namely a distance of $\lambda g$: consequently, a diode acting at point 25 or at a point 26 has the same action as if it were connected electrically to point 22. Such mounting of two subsidiary lines, perpendicular to the main line having a length at least equal to $\lambda g/2$ makes it possible to mount the two diodes of a limiter on the same face of the suspended line 14.

The assembly shown in FIG. 6 makes it possible to have two series limiting stages in the same suspended line 14. The first limiting stage is formed, like that of FIG. 5, by two diodes 15 and 16 mounted head to tail at the end of two subsidiary line sections 23 and 24. The second limiting stage is identical to the preceding one and has two diodes 29 and 30 mounted at the ends of two subsidiary line sections 27 and 28. The same design rules are valid for the second limiting stage. The distance which separates the first stage from the second limiting stage, namely the distance between points 22 and 31 in two parallel planes, is a multiple of $\lambda g/4$ (i.e. $n(\lambda g/4)$).

The assembly shown in FIG. 7 makes it possible to withstand more power, for the same limiting stage. This assembly corresponds to a two stage limiter, like that of FIG. 6, but the power which can be absorbed for each stage is doubled.

In fact, the limiter of the first stage, placed in a hyperfrequency plane passing through point 22, has two subsidiary line sections 23 and 24 which are themselves split in their external part with respect to the main suspended line 14. The subsidiary line section 23 has a length which is a multiple of $\lambda g/4$, for example $x(\lambda g/4)$, and it has a T shape, the two branches 35 and 36 of this T connected to branch 25 themselves having a length which is a multiple of λg/4, for example y(λg/4). The same goes for the second subsidiary line section 24, which is extended by two sections 37 and 38 forming a T. The outward-inward distance travelled by a hyperfrequency wave present at point 2 on the suspended line 14, as far as points 39 and 40 situated at the ends of the T shaped subsidiary lines, must be such that it is equal to or a multiple z of λg/2:

$$x(\lambda g/4) = y(\lambda g/4) = z(\lambda g/2)$$

thus diodes fixed at points 39 and 40 have then the same effect as if they were fixed at points 22.

All the diodes have not been shown in this FIG. 7, so as not to overcrowd the drawing, but it is obvious that they are mounted to conform with what has been describe up to now, and that the two diodes fixed to the same subsidiary T shaped line, such as 24, are mounted in the same direction.

FIG. 8 shows the drawing for constructing the suspended line in a power limiter in accordance with the invention, formed as a triple plate line in accordance with the drawing of FIG. 1. This suspended line has four ends which correspond respectively to:

the inputs 11 and 12 are the outputs of the 3 db coupler referenced 3 in FIG. 1, the output 13 corresponds to the output of the 3 db coupler referenced 5 and coupled to a grounded load, the output 10 is coupled to a coaxial connector.

This suspended line comprises two limiting stages 4,8 mounted in parallel in two channels, and an additional limiting stage at 9, in an output channel connected to the coaxial connector 10

By comparing with FIG. 6, it can be seen that two diodes are mounted in the same mechanical plane defined either by point 22 or by point 31, and that these diodes are connected electrically to the end 25 or 26 of the subsidiary line sections 23 and 24.

The limiter for which the invention has been conceived is a power limiter, and the use of a 3 db coupler at the input reduces by half the power received by each diode stage. The first stage comprising diodes 15 and 16 placed in a channel, in the case of a malfunction, will only see half power for a time on the order of 5 microseconds. To provide good limitation characteristics, silicon PIN diodes are used. As a principle characteristic in passivated MESA technology, they have:

a breakdown voltage on the order of 50V for improving the limitation, a junction capacity on the order of 0.5 Pf, These diodes are single diodes, or else diodes mounted in series in the same case. This make it possible to double the area of the diode chip while maintaining an identical junction capacity under operating conditions. Such a circuit improves the thermal characteristic of the diode and so its lifespan. The performances of the first power stage of this limiter are 20 db of limitation and 0.3 db loss.

The second stage of the limiter, in each of the branches, is still formed of diodes mounted in the same mechanical plane passing through point 1. This point 31 is situated in a plane removed by λg/4 or a multiple from the plane passing through point 22 of a first stage, and the diodes are thus matched.

This second diode stage may be formed with silicon PIN diodes identical to the diodes of the first stage, but it may also be formed with gallium arsenide varactor diodes. Whatever the solution chosen, this stage has a limitation of 20 db, +6 db due to the presence of the preceding limiting stage, and losses equal to 0.3 db if the diodes are made from silicon and 0.2 db if the diodes are made from gallium arsenide.

The two limiting branches are coupled in a 3 db coupler shown at 5, and after the output of the coupler an additional limiting stage is mounted in the output channel which goes towards the connector at point 10. The purpose of this additional limiting stage is to limit the emergent power to a level such as 10 mW under normal operating conditions and 40 mW in the case of a malfunction. The diodes used are gallium arsenide or silicon type diodes, operating as choppers and thus avoiding any parasite phenomenon in the output signal.

The performances of the final limiting stage are 20 db limitation and 0.2 db loss.

This suspended line 14, stamped from a metal sheet sufficiently thick to be handled, is mounted as shown in FIG. 9 so as to form a triple plate line limiter.

In FIG. 9, which shows in section the end of a subsidiary line such as 23, 24, the section 23 of the suspended line is held in position between two dielectric plates, made from alumina or teflon for example, referenced at 41 and 42. These two plates are themselves clamped between two metal conducting blocks forming ground planes 17 and 18. In one of the dielectric plates, 42 for example, and at a position corresponding to the end 25 of a subsidiary line 23, a hole is provided for positioning a diode 15 mounted in a cylindrical case having a shank 43 which serves both for holding it in position and applying it against the subsidiary line 23, and as a series matching means such as a coaxial line. A metal screw 44, passing through a threaded orifice formed in the ground plane 17 provides contact with the diode 15, through its shank 43 forming a coaxial line.

Of course, FIG. 9 only shows a small part of the complete section of a triple plate line limiter, but it is clear that since all the diodes are mounted on the same side with respect to the central suspended line, that it is sufficient to unscrew screws 44 so as to have access to diodes 15, 16, 29, 30, etc. . . , and to be able to change the type of diode or tune them by the coaxial length 43.

The accessiblity and maintenance of a limiter in accordance with the invention are therefore much better than with limiters of the prior art.

The invention has been described with reference to a limiter; however, if the length of the subsidiary lines such as 23 and 24 or if the distance between two mechanical planes passing though points 22 and 33 are varied, it can be made into a phase shifter. Furthermore, the diodes are connected to the ground plane 17 in a limiter, it being understood that the ground planes 17 and 18 are in electrical contact. If, instead of connecting the diodes to ground, they are biased, a switch can be obtained.

More generally, the invention applies to all hyperfrequency devices using two diodes mounted with respect to the central web of a triple plate line, and it relates to the hyperfrequency equipment used for radars and telecommunications or satellites. It is stated more precisely in the following claims.

Obviously, numerous modifications and variations of the present invention are possible in light of the above teachings. It is therefore to be understood that within the scope of the appended claims, the invention may be practiced otherwise than as specifically described herein.

We claim:

1. A hyperfrequency diode device, which comprises:
   a triple plate line formed by a suspended line placed between two ground planes,
   at least two diodes connected respectively between said suspended line and said ground planes wherein said suspended line transports a hyperfrequency signal of a guided wave length $\lambda g$, and
   said suspended line comprises two subsidiary line sections connected to a main suspended line section and which are oriented substantially orthogonal thereto, each of said diodes being mounted at a free end of a respective one of said subsidiary line sections, each respective free end being point spaced by $\lambda g/2$ or a multiple of $\lambda g/2$ from a central point of the main suspended line and situated in the same plane, wherein the at least two diodes are connected to the two subsidiary line sections on the same side with respect to the plane formed by the main suspended line section and by the two subsidiary line sections.

2. The hyperfrequency device as claimed in claim 1 wherein one of the at least two diodes is mounted with an anode connected to one of the subsidiary line sections and a cathode connected to one of said ground planes, whereas the other diode is mounted with a cathode to the other subsidiary line section and an anode connected to said one of said ground planes.

3. A hyperfrequency diode device, which comprises:
   a triple plate line formed by a suspended line placed between two ground planes,
   at least two diodes connected respectively between said suspended line and said ground planes wherein said suspended line transports a hyperfrequency signal of a guided wave length $\lambda g$, and
   said suspended line comprises two subsidiary line sections connected to a min suspended line section and which are oriented substantially orthogonal thereto, each of said diodes being connected at a free end of a respective one of said subsidiary line sections, each free end being a point spaced by $\lambda g/2$ or a multiple of $\lambda g/2$ from a central point of the main suspended line and situated in the same plane; and
   a second stage formed of two further subsidiary line sections connected to the main suspended line section, and oriented substantially orthogonal thereto, and two respective further diodes connected to the further subsidiary line sections, said diodes being connected at two points which are respectively spaced by $\lambda g/2$ from a central point of the main line section, the distance, measured along the main line, between the first stage of the second stage being a multiple of $\lambda g/2$.

4. The hyperfrequency device as claimed in claim 1, wherein said two subsidiary line sections are each substantially in the form of a T, and wherein end portions of said T include arms which have a length at least equal to or a multiple of $\lambda g/4$, so that the diodes are connected by a distance from the central point of the main line equal to or a multiple of $\lambda g/2$.

5. The hyperfrequency device as claimed in claim 4, wherein for each of said subsidiary line sections, said diodes are respectively connected to the ends of the arms of the T.

6. The hyperfrequency device as claim in claim 1, wherein said device comprises a hyperfrequency limiter.

7. The hyperfrequency device as claimed in claim 1, wherein with each diode situated on the same side with respect to the plane formed by the main line section and the subsidiary line section, each diode is respectively connected to said subsidiary line section by means of a screw.

* * * * *